United States Patent [19]
Lucioni et al.

[11] Patent Number: 5,315,621
[45] Date of Patent: May 24, 1994

[54] ADAPTIVE NONRECURSIVE DIGITAL FILTER AND METHOD FOR FORMING FILTER COEFFICIENTS THEREFOR

[75] Inventors: Gonzalo Lucioni, Bochum; Lajos Gazsi, Düsseldorf, both of Fed. Rep. of Germany

[73] Assignee: Siemens Aktiengesellschaft, Munich, Fed. Rep. of Germany

[21] Appl. No.: 14,839

[22] Filed: Feb. 8, 1993

[30] Foreign Application Priority Data

Feb. 7, 1992 [EP] European Pat. Off. ......... 92102094.7

[51] Int. Cl.$^5$ .............................................. H04B 1/10
[52] U.S. Cl. .................................. 375/103; 364/724.19
[58] Field of Search ...................... 375/11, 12, 14, 15, 375/103; 364/724.19, 724.2, 724.16; 333/18

[56] References Cited

U.S. PATENT DOCUMENTS

| | | | |
|---|---|---|---|
| 4,872,184 | 10/1989 | Yamaguchi et al. | 375/14 |
| 5,210,774 | 5/1993 | Abbiate | 364/724.2 |
| 5,214,671 | 5/1993 | Nakai | 364/724.2 |

FOREIGN PATENT DOCUMENTS

| | | |
|---|---|---|
| 0121992 | 10/1984 | European Pat. Off. |
| 0453201 | 10/1991 | European Pat. Off. |
| 3220812 | 9/1991 | Japan |

OTHER PUBLICATIONS

"Fast Algorithms for Block FIR Adaptive Digital Filtering", Mikhael et al, IEEE TRansactions on Circuits Systems, Oct. 1987, No. 10, pp. 1152–1160.
Adaptive Signal Processing: Widrow and Stearne: Prentice-Hall, Englewood Cliffs, New Jersey, 1985: pp. 99–114 and 290, are pertinent.

*Primary Examiner*—Stephen Chin
*Attorney, Agent, or Firm*—Herbert L. Lerner; Laurence A. Greenberg

[57] ABSTRACT

An adaptive nonrecursive digital filter includes a first filter unit having N controllable filter coefficients. A control unit controls the filter coefficients as a function of an input signal applied to the first filter unit at a given sampling rate and as a function of a difference between a reference signal and an output signal output by the first filter unit, in accordance with the least mean error square in each case. The first filter unit and the control unit sample the input signal and the reference signal continuously, with a cyclically varying delay, at a correspondingly increased sampling rate. A second filter unit is operated at the given sampling rate and has N controllable filter coefficients. The second filter unit receives the input signal, outputs a further output signal and has filter coefficients also being controlled by the control unit.

9 Claims, 2 Drawing Sheets

5,315,621

ADAPTIVE NONRECURSIVE DIGITAL FILTER AND METHOD FOR FORMING FILTER COEFFICIENTS THEREFOR

BACKGROUND OF THE INVENTION

Field of the Invention

The invention relates to an adaptive nonrecursive digital filter including a filter unit with N controllable filter coefficients, and a control unit controlling the filter coefficients as a function of an input signal applied to the filter unit, at a given sampling rate and as a function of a difference between a reference signal and an output signal output by the filter unit, in accordance with the least mean error square in each case.

The invention also relates to an adaptive nonrecursive digital filter including a signal processing device which, under program control from an input signal in combination with N controllable filter coefficients, generates an output signal, and in combination with a reference signal, in accordance with the least mean square error at the time, generates control signals for controlling the filter coefficients.

Adaptive digital filters are of major significance in many areas of discrete-time signal processing, particularly in the fields of system analysis, echo compensation at two-wire/four-wire junctions, removal of line distortion and speech processing. The characteristic of such adaptive digital filters, in comparison with constant digital filters, is that the filter parameters which determine the junction properties are adjusted optimally with respect to a quality functional. Such a quality function is achieved, for instance, due to the fact that the mean square error in the output signal of the adaptive digital filter relative to a reference signal is minimized.

That method, which is known generally as the least mean square algorithm, or LMS algorithm for short, is described by way of example in the book by B. Widrow and S. D. Stearns entitled "Adaptive Signal Processing", Prentice-Hall, Englewood Cliffs, N.J., 1985, particularly on pages 99-114. Page 290 of that same publication also shows a block diagram of the structure of an adaptive nonrecursive digital filter which operates according to the LMS algorithm. It includes a filter unit with a controllable filter coefficient, and a control unit that controls the filter coefficient both as a function of an input signal applied to the filter unit and as a function of the difference between a reference signal and an output signal output by the filter unit, in accordance with the least mean square error in each case.

The LMS algorithm is distinguished over other methods, such as the Newton method, by being less difficult and costly to achieve, but nevertheless it does not always have satisfactory convergence properties. Moreover, the LMS algorithm is based on the assumption of steady-state stochastic signals. This severely limits the field of application for adaptive nonrecursive digital filters operating by the LMS algorithm.

It is accordingly an object of the invention to provide an adaptive nonrecursive digital filter, which overcomes the hereinafore-mentioned disadvantages of the heretofore-known devices of this general type.

SUMMARY OF THE INVENTION

With the foregoing and other objects in view there is provided, in accordance with the invention, an adaptive nonrecursive digital filter, comprising a first filter unit having N controllable filter coefficients; a control unit controlling the filter coefficients as a function of an input signal applied to the first filter unit at a given sampling rate and as a function of a difference between a reference signal and an output signal output by the first filter unit, in accordance with the least mean error square in each case; the first filter unit and the control unit sampling the input signal and the reference signal continuously, with a cyclically varying delay, at a correspondingly increased sampling rate; and a second filter unit being operated at the given sampling rate and having N controllable filter coefficients, the second filter unit receiving the input signal, outputting a further output signal, and having filter coefficients also being controlled by the control unit.

In accordance with another feature of the invention, there is provided a first delay unit being triggered by the reference signal and having B outputs; and a first multiplexing unit being connected downstream of the first delay unit for cyclically and successively switching through one of the outputs of the first delay unit at the increased sampling rate, the first multiplexing unit having an output; the first filter unit having a second delay unit being triggered by the input signal and having $N+B-1$ outputs being assigned to B groups partly overlapping one another and each including N successive outputs; a second multiplexing unit connected downstream of the second delay unit for switching through one group of outputs of the second delay unit at a time cyclically in succession and in synchronism with the first multiplexing unit at the increased sampling rate; and a first linking unit connected downstream of the second multiplexing unit for weighting respective switched-through outputs of the second delay unit by the respective controlled filter coefficients and linking them together additively, the first linking unit having an output; a subtractor having one input connected to the output of the first linking unit, another input connected to the output of the first multiplexing unit, and an output; the control unit having a third delay unit being triggered by the input signal and having $N+B-1$ outputs being assigned to B groups, partly overlapping one another, and each including N successive outputs; a third multiplexing unit connected downstream of the third delay unit for switching through one group of outputs of the third delay unit at a time, cyclically in succession and in synchronism with the first multiplexing unit at the increased sampling rate; a multiplier unit connected downstream of the third multiplexing unit; a coefficient member connected between the multiplier unit and the output of the subtractor; and an integrator unit connected downstream of the multiplier unit, the integrator unit having outputs; the second filter unit having a fourth delay unit being triggered by the input signal and having N outputs; and a second linking unit connected downstream of the fourth delay unit for weighting the outputs of the fourth delay unit by the applicable controlled filter coefficients and linking them additively together; and the outputs of the integrating unit carrying signals for controlling the filter coefficients in the first and second filter units.

In accordance with a further feature of the invention, the second and third delay units are constructed as a common delay unit, and the second and third multiplexing units are constructed as a common multiplexing unit.

In accordance with an added feature of the invention, the place of the fourth delay unit is taken by a portion of the common delay unit having outputs being assigned to a certain group.

In accordance with an additional feature of the invention, there is provided a monitoring device connected between the coefficient member and the output of the subtractor, for setting an error signal appearing at the output of the subtractor equal to zero, if the error signal drops below a given minimum amount.

In accordance with yet another feature of the invention, there is provided another subtractor to which the reference signal and the further output signal are supplied.

With the objects of the invention in view, there is also provided a method for forming filter coefficients for a adaptive nonrecursive digital filter having a signal processing device operating under program control for generating an output signal from an input signal connected with N controllable filter coefficients for generating control signals for controlling the filter coefficients in combination with a reference signal, in accordance with the least mean square error, which comprises continuously storing sampled values of the input signal and of the reference signal in memory, each at discrete sampling times and each for a certain number of sampling times; assigning $N+B-1$ successive stored sampled values of the input signal to B groups partly overlapping one another, each of the groups including N sampled values; forming a sum of all of the sampled values of the input signal belonging to a certain group, each sampled value being weighted with one of the filter coefficients for producing a further output signal; multiplying the stored sampled values of the input signals multiple times cyclically and in groups with an error signal being weighted by a coefficient, and subsequently integrating the samples, producing the control signals for the coefficients; cyclically weighting in groups, the sum of all of the sampled values of the input signal belonging to the applicable group with one of the filter coefficients being formed; and subtracting this sum from one of B stored sampled values of the reference signal, producing the error signal.

In accordance with another mode of the invention, there is provided a method which comprises setting the error signal equal to zero if it drops below a given minimum amount.

In accordance with a concomitant mode of the invention, there is provided a method which comprises subtracting the further output signal from the reference signal.

Other features which are considered as characteristic for the invention are set forth in the appended claims.

Although the invention is illustrated and described herein as embodied in an adaptive nonrecursive digital filter and a method for forming filter coefficients therefor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
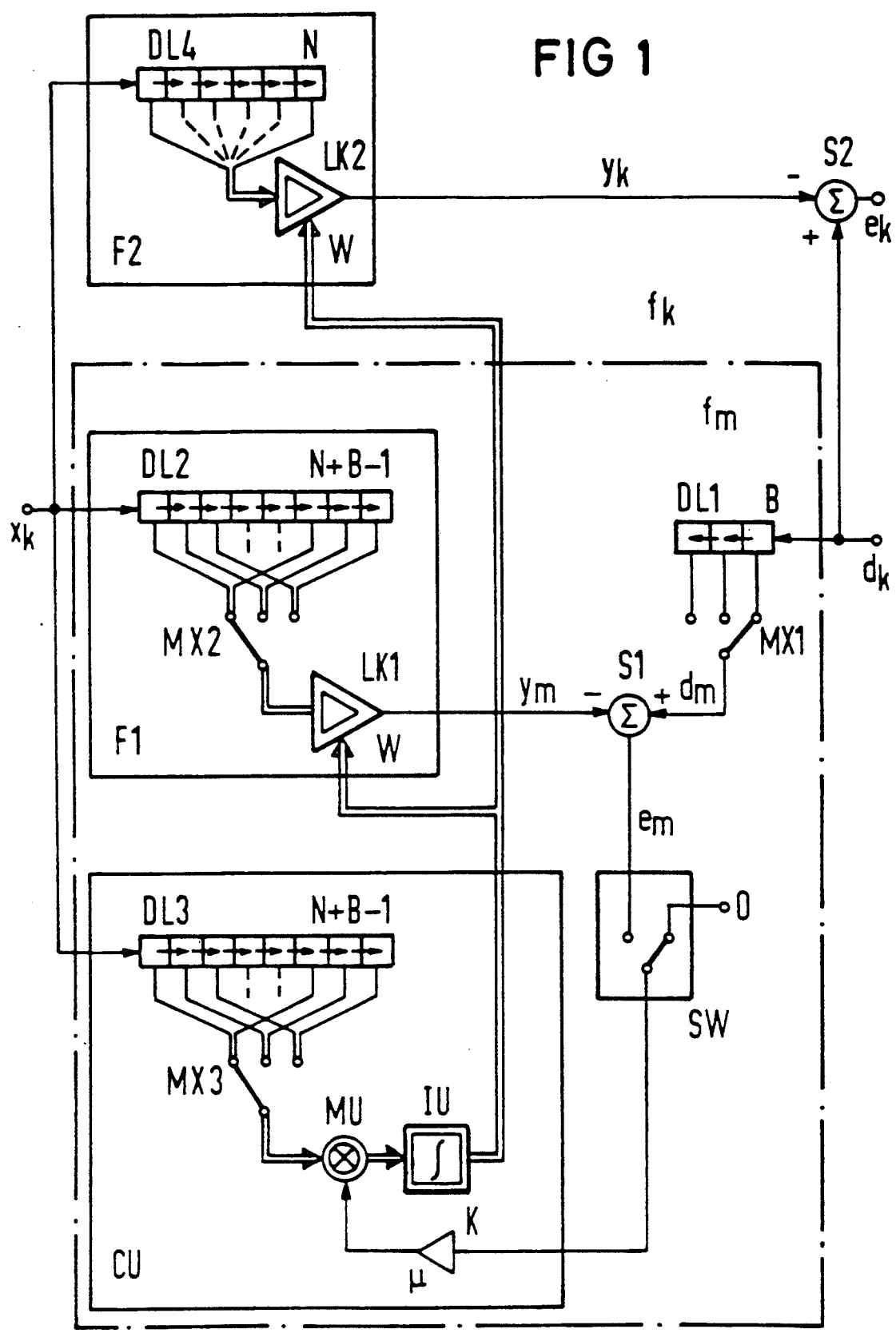
FIG. 1 is a schematic and block circuit diagram of a first, general embodiment of an adaptive nonrecursive digital filter according to the invention.

Referring now in detail to the figures of the drawing, in which identical elements are provided with the same reference numerals, and first, particularly, to FIG. 1 thereof, there is seen an adaptive nonrecursive digital filter according to the invention which has a first filter unit F1 with N controllable filter coefficients W and a control unit CU, which controls the filter coefficients W, both as a function of an input signal $x_k$ applied to the first filter unit F1 at a given sampling rate $f_k$, and as a function of a difference formed by a subtractor S1, between a reference signal $d_m$ and an output signal $y_m$ output by the first filter unit F1, in accordance with the least mean square error in each case. The first filter unit F1 and the control unit CU are operated at a correspondingly increased sampling rate $f_m$ compared with the sampling rate $f_k$ of the input signal $x_k$. The input signal $x_k$ and the reference signal $d_k$ are sampled continuously, or in other words multiple times, with a cyclically varying delay between two sampling times of the input signal $x_k$.

In addition, a second or further filter unit F2 that is operated at the given sampling rate $f_k$ likewise has the filter coefficients W controlled by the control unit CU. The second or further filter unit F2 is triggered by the input signal $x_k$ and outputs a further output signal $y_k$. A delay unit DL1 is triggered by the reference signal $d_k$ and has B outputs at which the reference signal $d_k$ is applied with variable delays forming the reference signal $d_m$. A following multiplexing unit MX1 cyclically and successively switches through one of the outputs of the delay unit DL1 at the increased sampling rate $f_m$.

The first filter unit F1 includes a delay unit DL2 being triggered by the input signal $x_k$ and having $N+B-1$ outputs, which are assigned to B groups that partly overlap one another and each include N successive outputs. The first filter unit F1 has a following multiplexing unit MX2, which switches through one group at a time of outputs of the delay unit DL2 cyclically one after another and in synchronism with multiplexing unit MX1 at the increased sampling rate $f_k$. Following the multiplexing unit MX2, the first filter unit F1 has a linking unit LK1, which weights the respectively switched-through outputs of the delay unit DL2 with the filter coefficients W being controlled at the time and links them additively together. The output of the linking unit LK1 is carried to one input of the subtractor S1 that has another input which is connected to the output of the multiplexing unit MX1. The control input CU includes a delay unit DL3 which is triggered by the input signal $x_k$ and has $N+B-1$ outputs, and B groups that partly overlap one another and are each assigned to N successive outputs. The control input CU has a following multiplexing unit MX3, which switches through one group at a time of outputs of the delay unit DL3 cyclically and in succession and in synchronism with the multiplexing unit MX1 at the increased sampling rate $f_m$. Following the unit MX3, the control input CU has a multiplier unit MU, which is additionally connected to the output of the subtractor S1 with the interposition of a coefficient member K. Finally, the multiplier unit MU is followed by an integrating unit IU.

The second or further filter unit F2 includes a delay unit DL4 being triggered by the input signal $x_k$ and having N outputs. The second or further filter unit F2 has a following linking unit LK2, which weights the outputs of the delay unit DL4 with the respective controlled filter coefficients W and links them together additively. In both linking units LK1, LK2, the filter coefficients W are controlled by signals that are applied to the outputs of the integrating unit IU.

According to a further feature of the invention, a monitoring device SW is connected between the subtractor S1 and the coefficient member K. If an error signal $e_m$ appearing at the output of the subtractor S1 drops below a given minimum amount, the monitoring device SW sets the error signal $e_m$ equal to zero.

The output of the linking unit LK2, which carries the further output signal $y_k$, is also connected to one input of a subtractor S2 having another input to which the reference signal $d_k$ is applied. A reception signal $e_k$ appears at the output of the subtractor S2. In this case, the input signal $x_k$ is assumed to be a transmission signal and the reference signal $d_k$ is assumed to be a reception signal that has an echo, as in the case of a telephone set, for instance. The reception signal $e_k$ is then echo-free.

Figure 2:
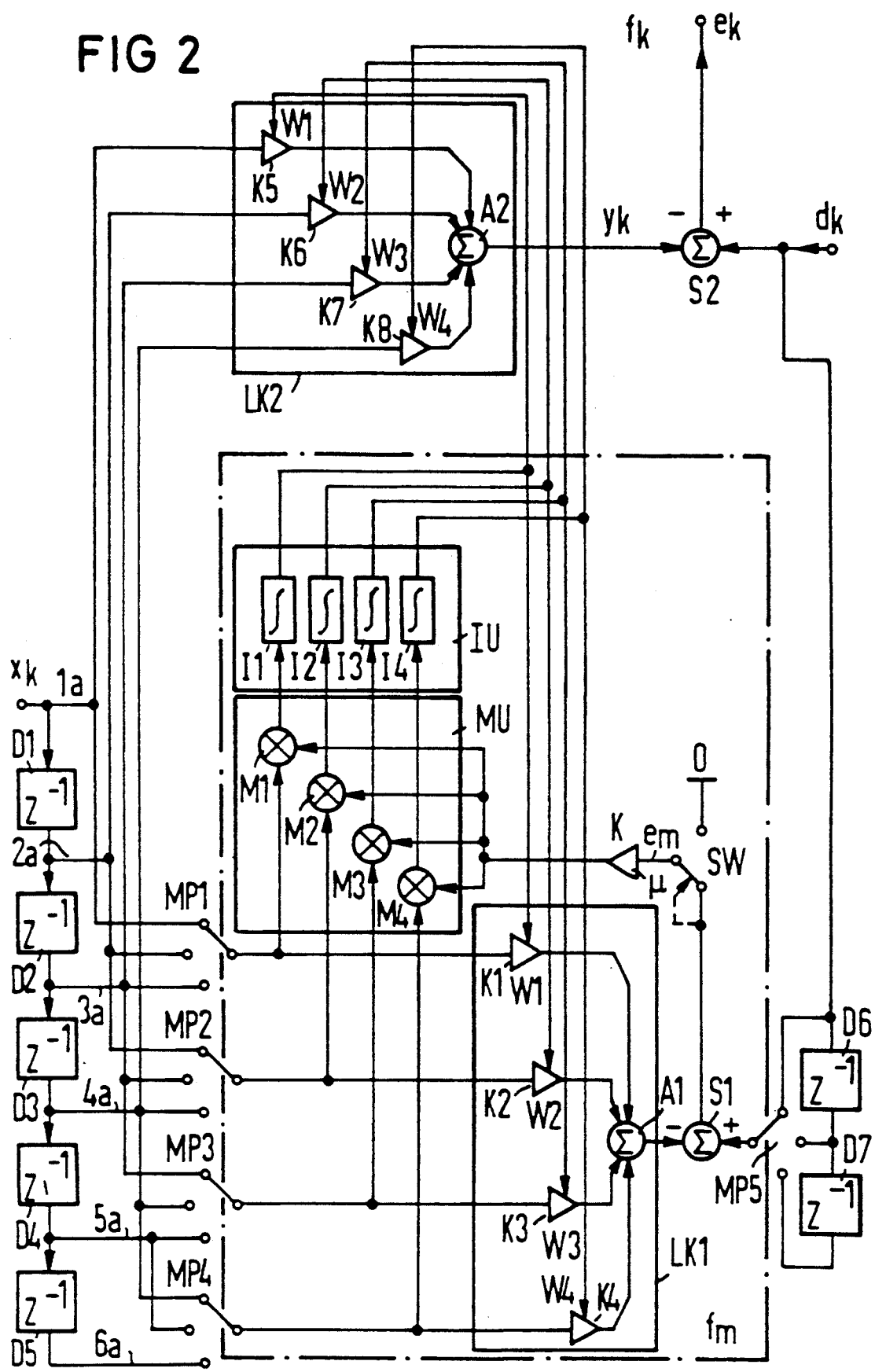
FIG. 2 is a schematic and block circuit diagram of a second, concrete embodiment of a adaptive nonrecursive digital filter according to the invention.

In the embodiment of FIG. 2, the values selected were N=4 and B=3. Moreover, the delay units DL2, DL3, DL4 of FIG. 1 were replaced by a single delay unit. This unit includes five series-connected delay elements D1-D5 and has six outputs, in accordance with N+B−1=6, where N=4 and B=3. The input of the first delay element D1 is simultaneously used as an output as well. The input signal $x_k$ is applied to the input of the first delay element D1. Outputs 1a-6a are divided into B=3 groups each having N=4 outputs. Group 1 then includes the outputs 1a, 2a, 3a, 4a; group 2 includes the outputs 2a, 3a, 4a, 5a; and group 3 includes the outputs 3a, 4a, 5a, 6a. Multiplexers MP1-MP4, each having B=3 inputs and each have one output, cyclically switch through the particular outputs belonging to one group, at the correspondingly increased sampling rate $f_m$. This means that in a first switching state of the multiplexers MP1-MP4, the outputs 1a, 2a, 3a, 4a are switched through, while in a second switching state, the outputs 2a, 3a, 4a, 5a, and finally in a third switching state, the outputs 3a, 4a, 5a, 6a, are switched through. The multiplexers MP1-MP4 are each followed by a respective multiplier M1-M4 and by a respective controllable coefficient member K1-K4, which have filter coefficients W1-W4, having outputs that are carried to an adder A1. Integrators I1-I4 are each connected to the output of a respective one of the multipliers M1-M4, to which the error signal $e_m$ is also applied, with the interposition of the coefficient member K having the coefficient $\mu$.

The output of the adder A1 is carried to one input of the subtractor S1 which has another input that is connected to the output of a multiplier MP5. The multiplier MP5 has three inputs, which are connected to the outputs of two series-connected delay elements D6 and D7 and to the input of the delay element D6. The reference signal $d_k$ is applied to the input of the delay element D6. The four multiplexers MP1-MP4 form the multiplexing units MX2 and MX3 of FIG. 1; the multiplexer MP5 forms the multiplexing unit MX1 of FIG. 1; the four integrators I1-I4 form the integrating unit IU of FIG. 1; the multipliers M1-M4 form the multiplier unit MU of FIG. 1; and the delay elements D6 and D7 form the delay unit DL1 of FIG. 1. The coefficient members K1-K4, together with the adders A1, form a linking unit corresponding to the linking unit LK1 of FIG. 1. Corresponding to FIG. 1, the output of the subtractor S1 in FIG. 2 is also carried to the switching device SW, which outputs either the output of the subtractor S1 or a zero signal as an error signal $e_m$ to the multipliers M1-M4 through the coefficient member, as a function of a minimum amount. The integrators I1-I4, the multiplexers MP1-MP5, the multipliers M1-M4, the controllable coefficient members K1-K4, the switching unit SW, the coefficient member K, the adder A1, and the subtractor S2, in combination with the delay elements D1-D7, are operated at the correspondingly increased sampling rate $f_m$. The sampling rate $f_m$ depends on the sampling rate $f_k$ of the input signal $x_k$ and on the number B of outputs of the delay unit DL1 having the delay elements D6 and D7, and on a given factor M, as follows:

$$f_m = MBf_k, \text{ where } M > 1 \tag{1}$$

The integrators I1-I4 control not only the coefficient members K1-K4 but they each also control a respective coefficient member K5-K8 with a respective filter coefficient W1-W4. The coefficient members K5-K8 have outputs which are carried to an adder A2 that has an output at which the further output signal $y_k$ is present. On the input side, the coefficient members K5-K8 are connected to the outputs 1a, 2a, 3a, 4a of the delay elements D1-D5 belonging to the first group.

The output of the adder A2 is connected to the input of the subtractor S2 which has an output that carries the reception signal $e_k$. The coefficient members K5-K8, together with the adder A2 of FIG. 2, are equivalent to the linking unit LK2 of FIG. 1.

Besides a direct construction with circuitry, it is alternatively also possible to implement an adaptive non-recursive digital filter according to the invention in a data processing system, particularly a signal processor system. The block diagrams shown in FIGS. 1 and 2 can easily be converted into appropriate programs for this purpose. By way of example, individual function structures are then provided as subroutines. Under program control, suitably prepared signal processing devices then continuously carry out the method steps described below, for example, in each case at discrete sampling times of the input signal $x_k$. First, sampled values of the input signal $x_k$ and of the reference signal $d_k$ are stored in memory, each for a certain number of sampling times. N+B−1 successive stored sample values of the input signal $x_k$ are assigned to B groups, partly overlapping one another, and each including N sampled values. Next, the sum is formed of all of the sampled values of the input signal $x_k$, belonging to a certain group and each being weighted with one of the filter coefficients W, resulting in the further output signal $y_k$. Finally, multiple times, as a function of the factor M, on one hand the stored sampled values of the input signal $x_k$ are multiplied cyclically and in groups by the error signal $e_m$, weighted by the coefficient K, and subsequently each is integrated by itself, producing the control signals for the coefficients W, and on the other hand, cyclically and in groups, the sums of all of the sampled values of the input signal $x_k$ belonging to the applicable group and being weighted with one of the filter coefficients W, are formed, and these sums are subtracted from one of the B stored sampled values of the reference signal $d_k$, resulting in the error signal $e_m$.

According to a further feature of the invention, the further output signal $y_k$ is subtracted from the reference signal $d_k$, producing the reception signal $e_k$.

According to another feature of the invention, it is provided that if the second error signal $e_m$ drops below a given minimum amount, then the error signal $e_m$ is set equal to zero.

Now that the basic structure of adaptive nonrecursive digital filters according to the invention has been described, their mode of operation will be described formally in further detail.

Taking a nonrecursive digital filter of the second canonic structure as a point of departure, having N coefficients $w_1, \ldots, w_N$, which can be described as coefficient vectors $W=(w_1, \ldots, w_N)^T$, the input signal $x_k$ and the further output signal $y_k$ relate to one another as follows:

$$y_k = X_k^T \cdot W = W^T \cdot X_k, \quad (2)$$

where $$X_k = (x_k, x_k - 1, \ldots, x_{k-N+1})^T$$

An input signal vector $X_k$ describes the sampled values of the input signal $x_k$ that have been variously delayed by the delay units or the delay elements, or stored in memory. The reference sign $d_k$ is also given, which is weighted by the coefficient $\mu$. What is sought is a coefficient vector $W_{opt}$, which minimizes the error signal $e_k = d_k - y_k$ over a predetermined time window of B sampled values. Through the use of the LMS algorithm, the following adaptation rule is determined for the coefficients:

$$W = W + \mu \cdot e_k \cdot X_k \quad (3)$$

For a minimum error signal $e_k$, that is, $e_{k\ opt} = d - X_k^T W_{opt}$, the result is that as a result of the recursion in equation (3), interval from W to $W_{opt}$, if it decreases, is $$|e_k| > 2(|e_{k,opt}|)/(2-a_k) = |e_{min}| \quad (4)$$

in which $|e_{min}|$ represents the minimum amount, and in which the condition that follows must be met:

$$0 < a_k < 2 \quad (5),$$

where $$a_k = \mu \cdot |X_k|^2 \quad (6)$$

The condition in equation (4) is adequate for decreasing the interval between W and $W_{opt}$. Now if in equation (3), instead of the coefficient $\mu$, a time-dependent variable $\mu_k$ is selected, then equation (5) changes to become $$a_k = \mu_k \cdot |X_k|^2 \quad (7)$$

The condition in equation (4) is proof among other things that a convergence of the LMS algorithm within a time window of B sampled values, or within a block, for short, can be improved by providing that instead of one passage through a block (as in the LMS algorithm), $M > 1$ passages are performed. This statement applies particularly if equation (4) is satisfied, a priori, with a wide margin. Moreover, the condition according to equation (4), if it is considered for an expanded time window, certainly leads to a simultaneous conversion of the coefficient vector W toward the optimal coefficient vector $W_{opt}$ of the corresponding blocks, if equation (4) is satisfied for the individual blocks.

The advantage of an adaptive nonrecursive digital filter according to the invention is that there is no limitation to steady-state stochastic signals. The convergence properties are adequate in each operating case. Moreover, the requisite additional expenditure is merely one additional adaptive background filter and one additional memory, so that the advantageous low expense of the LMS algorithm as compared with other methods remains largely preserved. This is particularly the case because an adaptive digital filter according to the invention has functionally identical structures, which are equally advantageous for both direct construction by circuitry and implementation in a program-controlled signal processing device.

We claim:

1. An adaptive nonrecursive digital filter, comprising:
   a first filter unit having N controllable filter coefficients, N being a positive integer;
   a control unit with means for forming a difference, said control unit controlling the filter coefficients as a function of an input signal applied to said first filter unit at a given sampling rate and as a function of a difference formed by said difference forming means between a reference signal and an output signal output by said first filter unit, in accordance with the least mean error square in each case;
   said first filter unit and said control unit sampling the input signal and the reference signal continuously, with a cyclically varying delay, at a correspondingly increased sampling rate; and
   a second filter unit being operated at the given sampling rate and having N controllable filter coefficients, said second filter unit receiving the input signal, outputting a further output signal, and having filter coefficients also being controlled by said control unit.

2. The adaptive nonrecursive digital filter according to claim 1, including:
   a first delay unit being triggered by the reference signal and having B outputs, B being a positive integer; and a first multiplexing unit being connected downstream of said first delay unit for cyclically and successively switching through one of the outputs of said first delay unit at the increased sampling rate, said first multiplexing unit having an output;
   said first filter unit having a second delay unit being triggered by the input signal and having $N+B-1$ outputs being assigned to B groups partly overlapping one another and each including N successive outputs; a second multiplexing unit connected downstream of said second delay unit for switching through one group of outputs of said second delay unit at a time cyclically in succession and in synchronism with said first multiplexing unit at the increased sampling rate; and a first linking unit connected downstream of said second multiplexing unit for weighting respective switched-through outputs of said second delay unit by the respective controlled filter coefficients and linking them together additively, said first linking unit having an output;

a subtractor having one input connected to the output of said first linking unit, another input connected to the output of said first multiplexing unit, and an output;

said control unit having a third delay unit being triggered by the input signal and having $N+B-1$ outputs being assigned to B groups, partly overlapping one another, and each including N successive outputs; a third multiplexing unit connected downstream of said third delay unit for switching through one group of outputs of said third delay unit at a time, cyclically in succession and in synchronism with said first multiplexing unit at the increased sampling rate; a multiplier unit connected downstream of said third multiplexing unit; a coefficient member connected between said multiplier unit and the output of said subtractor; and an integrator unit connected downstream of said multiplier unit, said integrator unit having outputs;

said second filter unit having a fourth delay unit being triggered by the input signal and having N outputs; and a second linking unit connected downstream of said fourth delay unit for weighting the outputs of said fourth delay unit by the applicable controlled filter coefficients and linking them additively together; and the outputs of said integrating unit carrying signals for controlling the filter coefficients in said first and second filter units.

3. The adaptive nonrecursive digital filter according to claim 2, wherein said second and third delay units are constructed as a common delay unit, and said second and third multiplexing units are constructed as a common multiplexing unit.

4. The adaptive nonrecursive digital filter according to claim 3, wherein said fourth delay unit is formed by a portion of said common delay unit having outputs being assigned to a certain group.

5. The adaptive nonrecursive digital filter according to claim 2, including a monitoring device connected between said coefficient member and the output of said subtractor, for setting an error signal appearing at the output of said subtractor equal to zero, if the error signal drops below a given minimum amount.

6. The adaptive nonrecursive digital filter according to claim 2, including another subtractor to which the reference signal and the further output signal are supplied.

7. A method for forming filter coefficients for an adaptive nonrecursive digital filter having a signal processing device operating under program control for generating an output signal from an input signal connected with N controllable filter coefficients for generating control signals for controlling the filter coefficients in combination with a reference signal, in accordance with the least mean square error, where N and B positive integers, which method comprises:
 a) continuously storing sampled values of the input signal and of the reference signal in memory, each at discrete sampling times and each for a certain number of sampling times;
 b) assigning $N+B-1$ successive stored sampled values of the input signal to B groups partly overlapping one another, each of the groups including N sampled values;
 c) forming a sum of all of the sampled values of the input signal belonging to a certain group, each sampled value being weighted with one of the filter coefficients for producing a further output signal;
 d) multiplying the stored sampled values of the input signals multiple times cyclically and in groups with an error signal being weighted by a coefficient, and subsequently integrating the samples, producing the control signals for the coefficients;
 e) cyclically weighting in groups, the sum of all of the sampled values of the input signal belonging to the applicable group with one of the filter coefficients being formed; and
 f) subtracting this sum from one of B stored sampled values of the reference signal, producing the error signal.

8. The method according to claim 7, which comprises setting the error signal equal to zero if it drops below a given minimum amount.

9. The method according to claim 7, which comprises subtracting the further output signal from the reference signal.

* * * * *